(12) United States Patent
Tu et al.

(10) Patent No.: US 8,436,408 B2
(45) Date of Patent: May 7, 2013

(54) SEMICONDUCTOR DEVICE WITH DECOUPLING CAPACITOR DESIGN

(75) Inventors: Kuo-Chi Tu, Hsin-Chu (TW); Huey-Chi Chu, Hsin-Chu (TW); Kuo-Cheng Ching, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 555 days.

(21) Appl. No.: 12/212,096

(22) Filed: Sep. 17, 2008

(65) Prior Publication Data

US 2010/0065944 A1    Mar. 18, 2010

(51) Int. Cl.
*H01L 27/108* (2006.01)

(52) U.S. Cl.
USPC ............ 257/300; 257/E21.648; 257/E27.087; 438/957

(58) Field of Classification Search ................... 257/300, 257/310, 532, 536–7, 536–537, E21.648, 257/E27.087; 438/957
See application file for complete search history.

(56) References Cited

U.S. PATENT DOCUMENTS

| | | | |
|---|---|---|---|
| 6,433,381 B2 * | 8/2002 | Mizutani et al. | 257/311 |
| 6,677,637 B2 | 1/2004 | Bernstein et al. | |
| 6,737,728 B1 | 5/2004 | Block et al. | |
| 6,781,185 B2 | 8/2004 | Chen et al. | |
| 6,803,641 B2 | 10/2004 | Papa Rao et al. | |
| 6,936,881 B2 | 8/2005 | Yeo et al. | |
| 6,937,457 B2 | 8/2005 | Shih et al. | |
| 6,940,705 B2 | 9/2005 | Yeo et al. | |
| 6,955,960 B2 * | 10/2005 | Bhattacharyya | 438/240 |
| 7,276,751 B2 * | 10/2007 | Ho et al. | 257/296 |
| 7,301,217 B2 * | 11/2007 | Chung | 257/532 |
| 7,564,709 B2 * | 7/2009 | Chen et al. | 365/149 |
| 2005/0156277 A1 * | 7/2005 | Nakano et al. | 257/532 |
| 2006/0114050 A1 * | 6/2006 | Vathulya et al. | 327/359 |
| 2007/0267705 A1 * | 11/2007 | Won et al. | 257/379 |
| 2008/0122032 A1 | 5/2008 | Tu et al. | |

FOREIGN PATENT DOCUMENTS

CN    101252127 A    8/2008

* cited by examiner

*Primary Examiner* — David Vu

(74) *Attorney, Agent, or Firm* — Duane Morris LLP

(57) ABSTRACT

An integrated circuit includes a circuit module having a plurality of active components coupled between a pair of supply nodes, and a capacitive decoupling module coupled to the circuit module. The capacitive decoupling module includes a plurality of metal-insulator-metal (MiM) capacitors coupled in series between the pair of supply nodes, wherein a voltage between the supply nodes is divided across the plurality of MiM capacitors, thereby reducing voltage stress on the capacitors.

26 Claims, 5 Drawing Sheets

US 8,436,408 B2

SEMICONDUCTOR DEVICE WITH DECOUPLING CAPACITOR DESIGN

FIELD OF THE INVENTION

The present invention relates to capacitors for integrated circuits, and more particularly to decoupling capacitors for integrated circuits.

BACKGROUND OF THE INVENTION

In semiconductor chips, power lines and ground lines are routed to logic gates in integrated circuits. The current from power supply flows through power lines, logic gates, and finally to ground. During the switching of the logic gates, a large amount of change in the current occurs within a short period of time. Decoupling capacitors are used to absorb these glitches during current switching and to maintain a constant voltage between supply voltage and ground. Good decoupling capacitors should show high capacitance per unit area, low leakage current and short time constant.

One such decoupling capacitor known in the art is the area Metal-Insulator-Metal (MiM) capacitor. A MiM capacitor comprises two conductive metal layers and a dielectric insulator layer. The capacitance is formed between these two conductive metal layers. MiM capacitors can achieve both high unit capacitance and fast time constant. But, as integrated circuits shrink, dielectric reliability, as measured by, for example, time-dependent dielectric breakdown or TDDB, becomes a concern. The power line signal voltage has approached the maximum allowable stress voltage for the MiM decoupling capacitor, discouraging the use of MiM capacitors in decoupling circuits.

Desirable in the art is an improved decoupling capacitor design that would improve upon the conventional capacitor designs.

SUMMARY OF THE INVENTION

An integrated circuit includes a circuit module having a plurality of active components coupled between a pair of supply nodes, and a capacitive decoupling module coupled to the circuit module. The capacitive decoupling module includes a plurality of metal-insulator-metal (MiM) capacitors coupled in series between the pair of supply nodes, wherein a voltage between the supply nodes is divided across the plurality of MiM capacitors, thereby reducing voltage stress on the capacitors.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
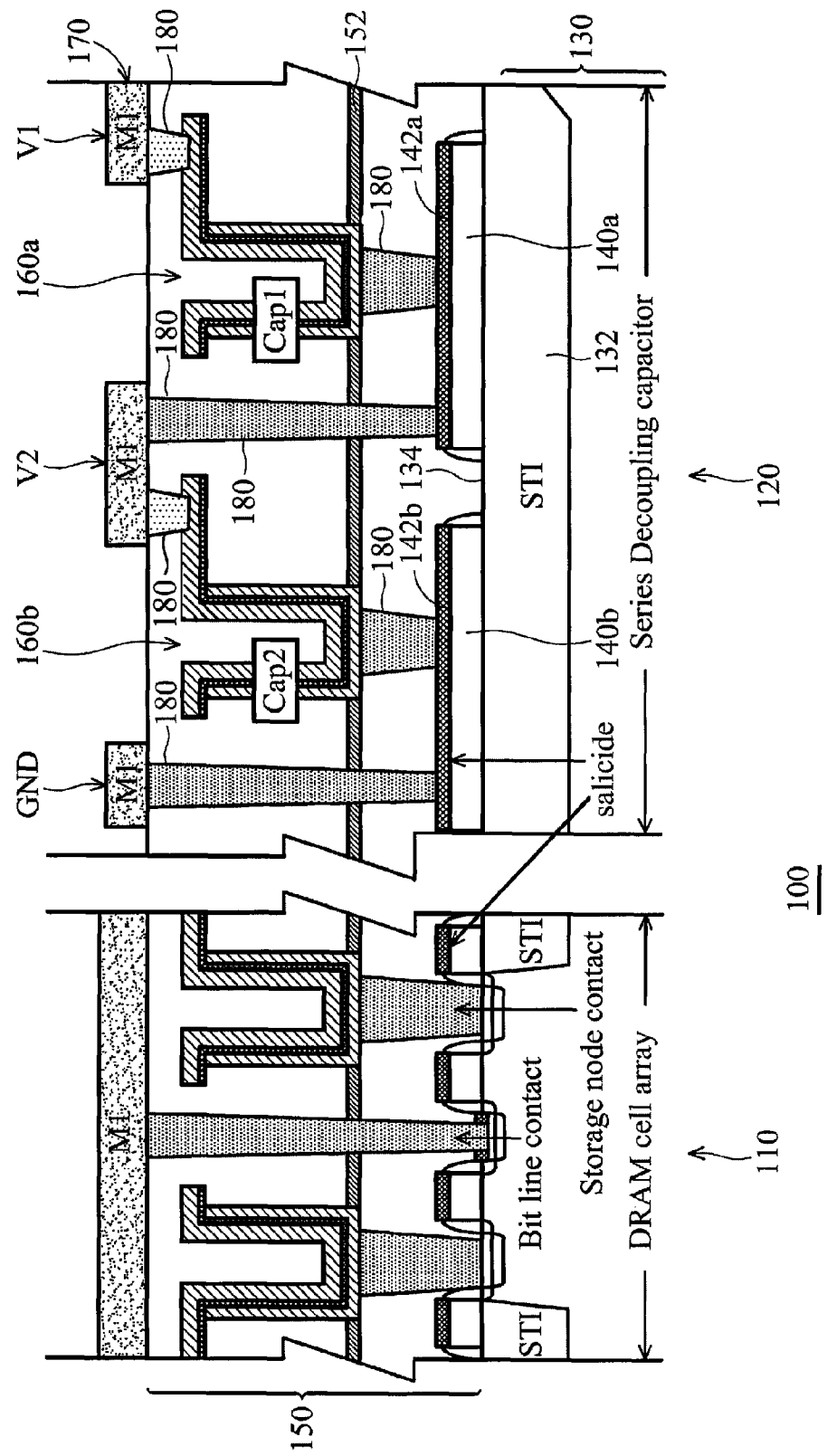
FIG. 1 shows a cross-section of an integrated circuit device of the present invention having an improved capacitive decoupling module.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Exemplary methods of forming integrated circuits having decoupling MiM capacitors are described in copending, commonly assigned U.S. patent application Ser. No. 11/504,693, entitled "Semiconductor Devices with MiM-Type Decoupling Capacitors and Fabrication Method Thereof" filed Aug. 16, 2006 and published as U.S. Publication No. 2008/0122032A1 on May 27, 2008, the entirety of which is hereby incorporated by reference herein.

With reference to FIG. 1, an integrated circuit device 100 is shown having one or more circuit modules 110 in a circuit module region. The circuit module has a plurality of active devices such as transistors and diodes. In the illustrated example, the circuit module 110 is an embedded DRAM cell array. The DRAM cell array is coupled between two voltage nodes that provide two voltage levels, for example, a positive supply voltage V1 and ground. The integrated circuit device 100 also includes a capacitive decoupling module 120 formed in a capacitive decoupling module region, which includes, as described in more detail below, a plurality of MiM capacitors coupled in series between the two supply voltage nodes, i.e., between positive power supply voltage V1 and ground (GND).

The integrated circuit device 100 is formed on a device substrate 130, formed from, for example, silicon, germanium, silicon germanium, semiconductor compounds, or other known semiconductor materials. The device substrate may also be a silicon-on-insulator substrate. The device substrate has an upper surface 134 and a shallow trench isolation region 132 formed therein, which extends into a portion of the circuit module 110. In the illustrated embodiment, the capacitive decoupling module 120 includes first and second MiM capacitors 160a and 160b formed in a dielectric layer 150. It should be understood that dielectric layer 150 can comprise one or more dielectric layers separated by an etch stop layer 152, which may comprise silicon nitride or silicon oxynitride. The dielectric layer can comprise any known low-k materials such as silicon oxide, silicon nitride, spin-on-glass (SOG), tetraethoxysilane (TEOS), hydrogenated silicon oxide, phosphorous silicon glass (PSG), boron phosphorous silicon glass (BPSG), fluorinated silicon glass (FSG), or similar materials. For purposes of the discussion herein, these dielectric layers can be considered one dielectric layer 150 formed between the device substrate 130 and first metal interconnect layer (M1) 170.

Each MiM capacitor has a first metal layer that serves as a bottom electrode, a second metal layer that serves as a top electrode, and a dielectric film sandwiched therebetween. The first and second metal layers may comprise Al, Au, Ag, Pd, Ta, Ti, W, or an alloy thereof. The dielectric film may comprise any known high-k materials such as aluminum oxide ($Al_2O_3$), hafnium oxide ($HfO_2$), silicon carbide (SiC), silicon nitride, tantalum oxide ($Ta_2O_5$), tantalum oxynitride, titanium oxide, zirconium oxide, lead zirconate titanate (PZT), strontium bismuth tantalite (SBT), bismuth strontium tantalite (BST), strontium tantalite (ST), or similar material.

In the illustrated embodiment, the first and second capacitors 160a and 160b are coupled in series between the two voltage nodes as follows. The first voltage node (V1) is coupled to top electrode of capacitor 160a through a conductive via (labeled 180). The bottom electrode of the capacitor 160a is coupled to a first lateral conductor formed over the upper surface 134 of the device substrate 130 through another conductive via. This first conductor is coupled to an intermediate voltage node labeled V2 in metal interconnect layer 170 by way of another conductive via. Similar connections are formed between voltage node V2 and ground node GND through the second capacitor 160b, various vias 180 and a second lateral conductor formed at the upper surface 134 of the device substrate 130.

In the embodiment of FIG. 1, the lateral conductors at the upper surface 134 of the device substrate are formed from respective polysilicon layers 140a, 140b, which may be formed when forming the polysilicon gates of the adjacent circuit module(s) 110. These polysilicon structures 140a, 140b are formed over shallow trench isolation region 132, which insulates the conductors from one another. Respective silicide regions 142a, 142 are formed in the upper surface of the polysilicon regions 140a, 140b and connect to vias 180.

Figure 2:
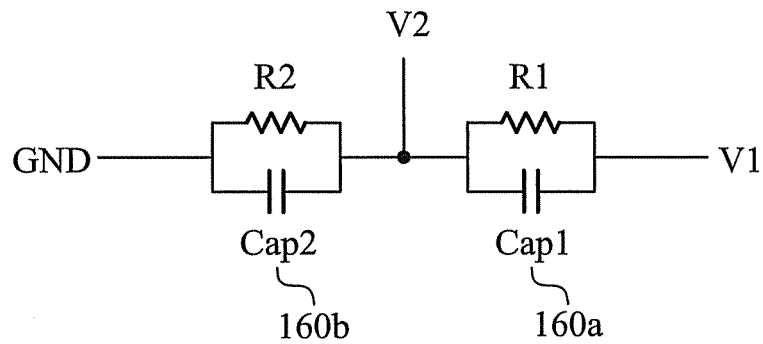
FIG. 2 is a circuit diagram of the capacitive decoupling module of FIG. 1.

FIG. 2 shows a circuit diagram of the capacitive decoupling module 120 shown in FIG. 1. Capacitors 160a and 160b are shown in series between nodes v1 and GND. Intermediate voltage node V2 connects the two capacitors in series. Each capacitor has an intrinsic resistance shown in the circuit diagram as R1 or R2. The series design effectively acts as a voltage divider, with the voltage at node V2 being set to ½ of the voltage at node V1. As such, the maximum voltage across either capacitor is ½ of the voltage at node V1. This lower voltage reduces the voltage stress across the oxide of the MiM capacitors in the capacitive decoupling module 120. This improvement is illustrated in the following examples.

TABLE A

| | Bias Condition 1 DRAM Core Supply Voltage | Bias Condition 2 DRAM cell array gate turn-on voltage | Bias Condition 3 DRAM cell array gate turn-off voltage |
|---|---|---|---|
| V1 | VDD = 1.2 V | VBB = 1.6 V | VPP = −0.4 V |
| MiM Capacitor Voltage | 1.2 V | 1.6 V | −0.4 V |
| TDDB | fail | fail | pass |

Table A shows the voltage across a MiM capacitor in a capacitive decoupling module having a single MiM capacitor under various bias conditions. MiM capacitor voltage must typically be at or under 0.8 V to meet reliability stress guarantees. When the core supply voltage of 1.2 V is applied between supply terminals or when the cell array gate turn-on voltage of 1.6 V is applied, the voltage across the MiM exceeds the applicable stress criteria.

TABLE B

| | Bias Condition 1 DRAM Core Supply Voltage | Bias Condition 2 DRAM Cell array gate turn-on voltage | Bias Condition 3 DRAM Cell array gate turn-off voltage |
|---|---|---|---|
| V1 | VDD = 1.2 V | VBB = 1.6 V | VPP = −0.4 V |
| V2 | ½ VDD = 0.6 V | ½ VDD = 0.8 V | ½ VDD = −0.2 V |
| MiM Capacitor Voltage (CAP 1) | 0.6 V | 0.8 V | −0.2 V |
| MiM Capacitor Voltage (CAP 2) | 0.6 V | 0.8 V | −0.2 V |
| TDDB | pass | pass | pass |

Figure 3:
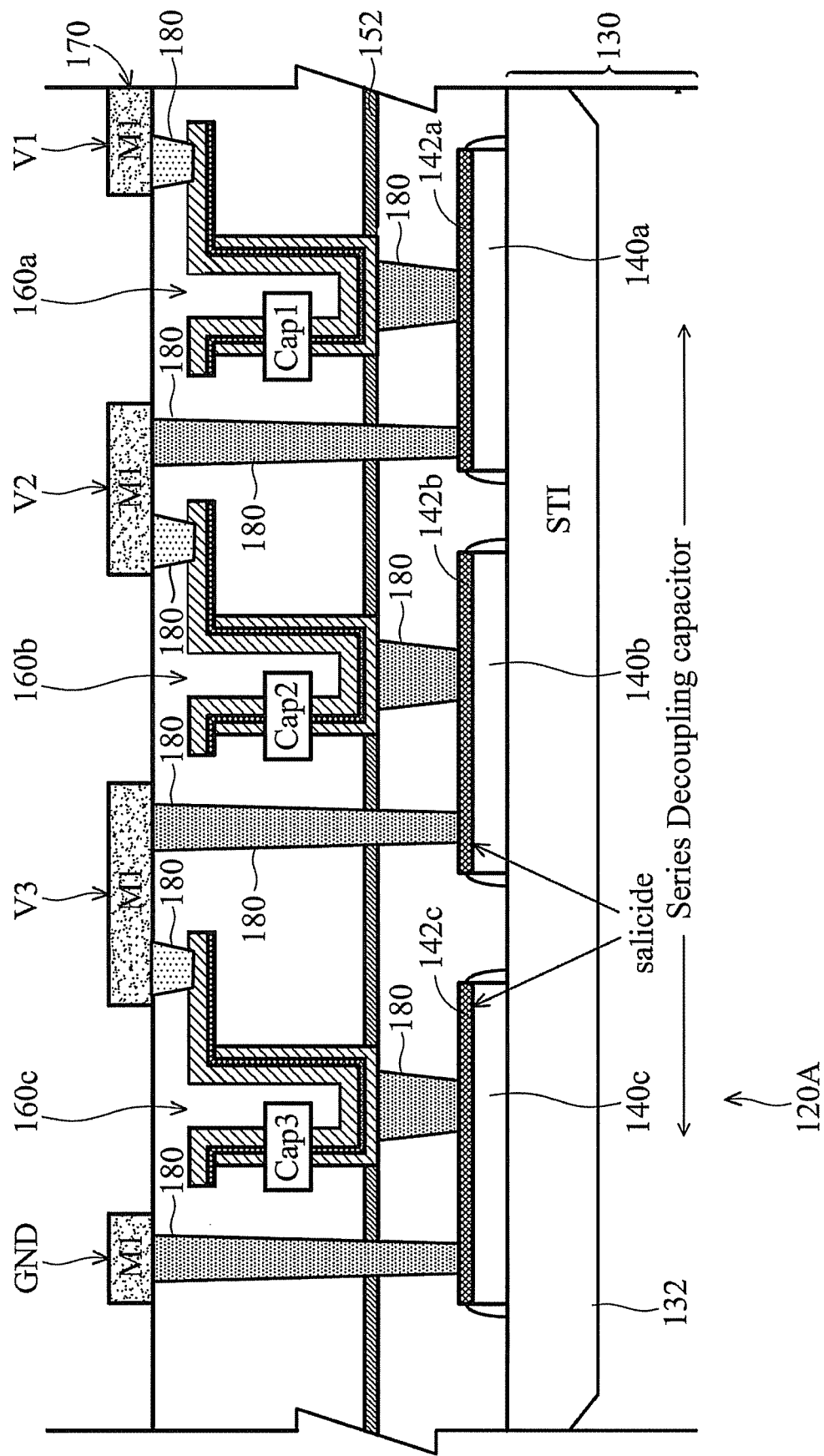
FIG. 3 is a cross-section of an alternative embodiment of a capacitive decoupling module.

As can be seen in Table B, by adding a second capacitor in series with the first capacitor, the voltage between the supply nodes is divided between the capacitors. Under core supply voltage conditions (1.2 V), the voltage across each capacitor is only 0.6 V, which is well within the stress criteria. When the gate turn-on voltage (1.6 V) is applied, the voltage across each capacitor is 0.8V, which is well below the 1.6 V of a single capacitor design but still close to the stress limits of the capacitor. As shown in the example of FIG. 3, additional MiM capacitors can be added in series to further divide the voltage stress amongst additional capacitors. The number of capacitors can be selected based on the voltage stress limits of the capacitors and the maximum bias to be applied between the supply nodes.

Figure 4:
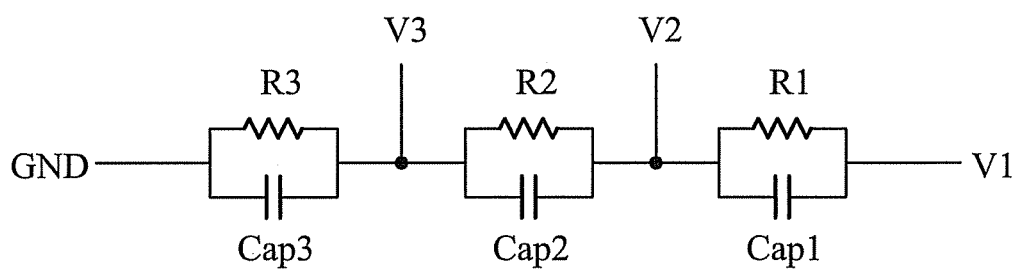
FIG. 4 is a circuit diagram of the capacitive decoupling module of FIG. 3.

FIG. 3 illustrates an embodiment of the decoupling module 120A having three series connected decoupling capacitors 160a, 160b and 160c rather than two. The corresponding circuit diagram is shown in FIG. 4. Table C below shows the resulting voltage levels under the biasing conditions discussed above for Tables A and B.

TABLE C

| | Bias Condition 1 DRAM Core Supply Voltage | Bias Condition 2 DRAM Cell array gate turn-on voltage | Bias Condition 3 DRAM Cell array gate turn-off voltage |
|---|---|---|---|
| V1 | VDD = 1.2 V | VBB = 1.6 V | VPP = −0.4 V |
| V2 | ⅔ VDD = 0.8 V | ⅔ VDD = 1.07 V | ⅔ VDD = −0.27 V |
| V3 | ⅓ VDD = 0.4 V | ⅓ VDD = 0.53 V | ⅓ VDD = −0.13 V |
| MiM Capacitor Voltage (CAP 1) | 0.4 V | 0.53 V | −0.13 V |
| MiM Capacitor Voltage (CAP 2) | 0.4 V | 0.53 V | −0.13 V |
| MiM Capacitor Voltage (CAP 3) | 0.4 V | 0.53 V | −0.13 V |

As can be seen from Table C, under all bias conditions, the voltage across the MiM capacitors falls well within the 0.8 V target voltage.

Although embodiments of two and three series coupled MiM capacitors are shown, it should be understood that any number of MiM capacitors can added in series to further divide the voltage stress as needed. The number of capacitors can be selected based on the voltage stress limits of the capacitors and the maximum bias to be applied between the supply nodes.

Figure 5:
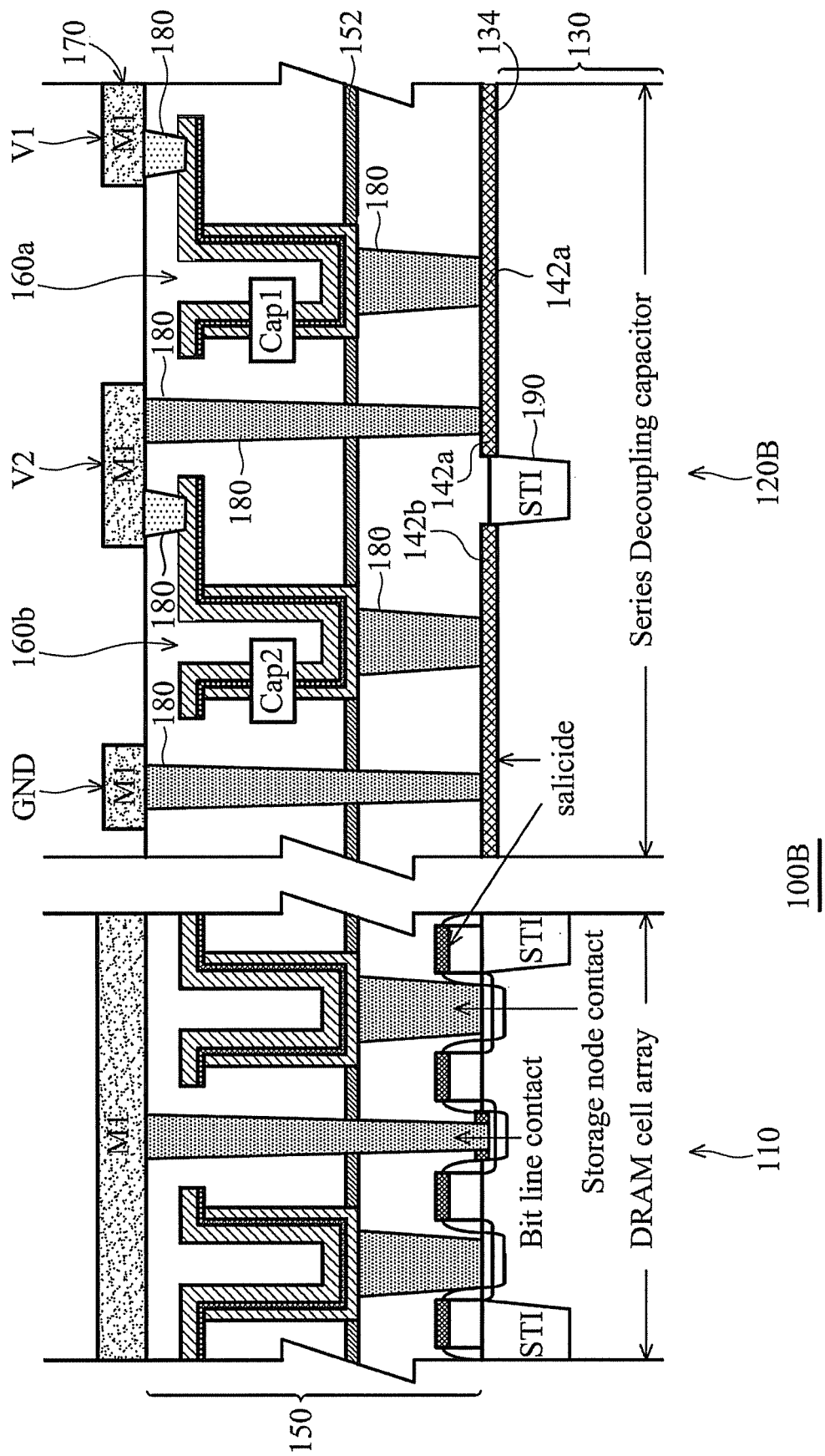
FIGS. 5 and 6 are cross-sections of alternative embodiments of the integrated circuit device of FIG. 1.

FIG. 5 shows an integrated circuit device 100B that is identical in all respects to the device 100 of FIG. 1 except for modifications made to capacitive decoupling module 120B. Specifically, the structure of the lateral conductors formed over the upper surface 134 of the device substrate 130 is modified. As noted above, these lateral conductors form, in connection with conductive vias, the conduction path between the bottom electrode plate of the individual MiM capacitors 160a, 160b and the intermediate voltage node V2 or GND node GND. In this embodiment, the silicide layers 142a and 142b are formed directly on or in the upper surface 134 of the substrate, which is exposed (i.e., not protected by a shallow trench isolation 132) for forming a salicide region. A shallow trench isolation 190 (or field oxide or other isolation structure) is formed between the silicide regions so as to isolate the two silicide regions.

Figure 6:
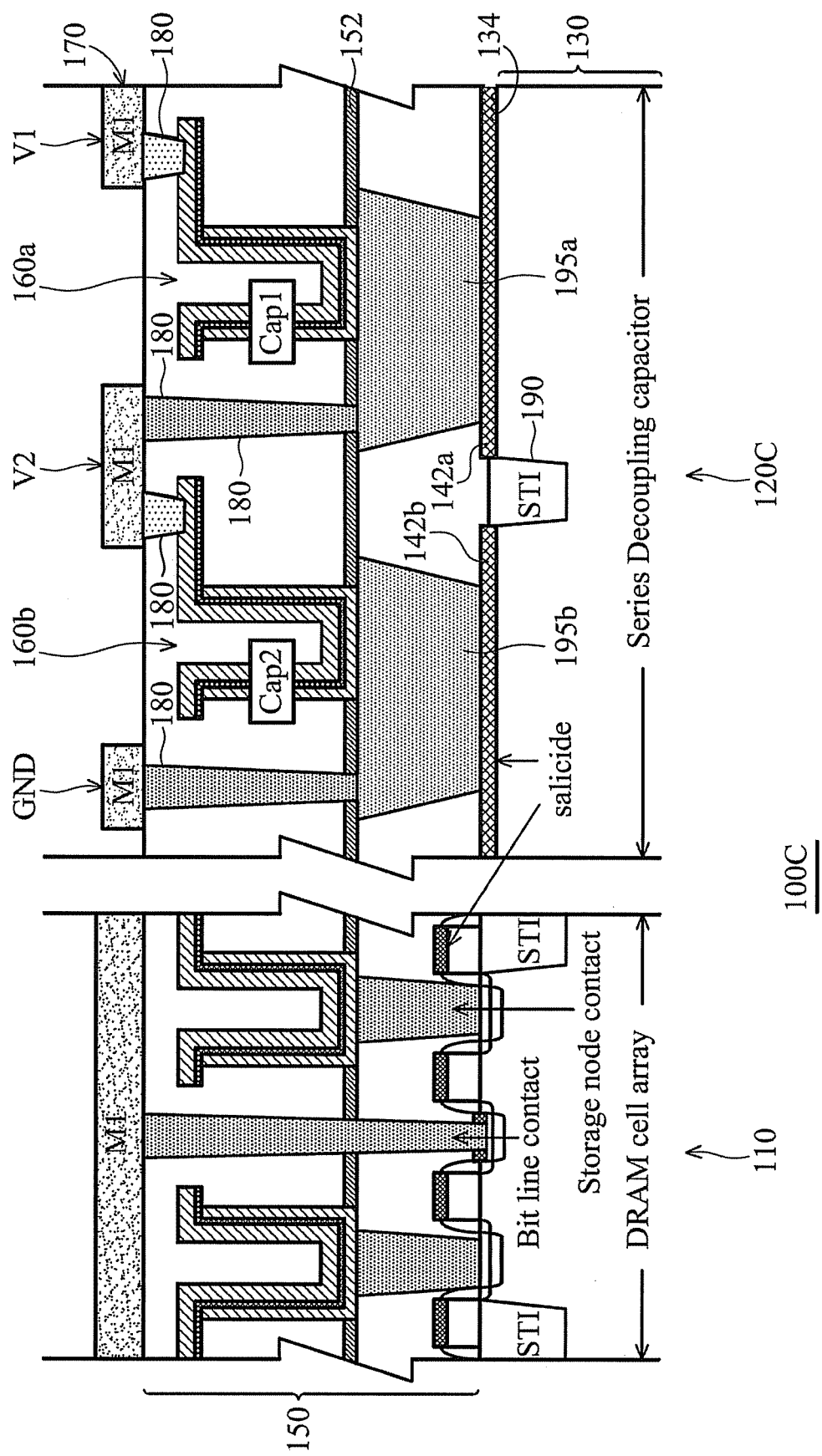

FIG. 6 shows an integrated circuit 100C that is identical in all respects to the device 100B of FIG. 5 except for modifications made to capacitive decoupling module 120C. In this embodiment, the vias 180 below etch stop layer 152 shown in capacitive decoupling module 100B of FIG. 4, which make contact to the silicide conduction pads 142a and 142b, are replaced with conductive plugs 195a and 195b. In embodiments, these plugs are formed from tungsten (W), copper (Cu), aluminum (Al) or alloys thereof. The device may also include one or more barrier layers (not shown) to reduce or prevent diffusion of the conductive plugs into the surrounding dielectric layers.

Figure 2A:
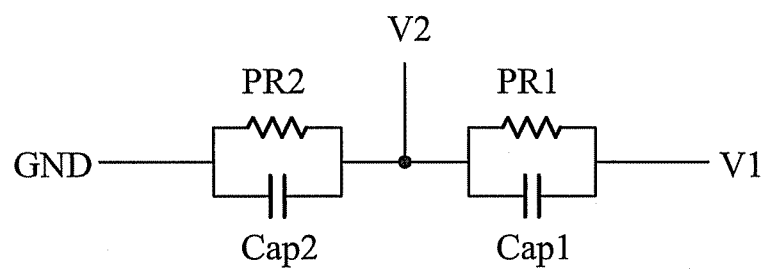
FIG. 2A is a circuit diagram of a capacitive decoupling module having polysilicon resistive elements constructed in parallel with MiM capacitors.

As shown in FIG. 2A, rather than relying on the intrinsic resistances of the MiM capacitors to help establish the voltage divider that sets the voltage at intermediate node V2, and thus divides the supply voltage across the capacitors, resistors, such as polysilicon resistors PR1 and PR2, can be constructed in parallel with each MiM capacitor. These resistors are effective in providing a stable division of voltage across the capacitors between the supply nodes V1 and GND.

As described herein, an improved capacitive decoupling module is presented utilizing MiM capacitors with reduced voltage stresses on the capacitors of the decoupling module. This approach allows for the use of MiM capacitors in decoupling modules where their use would previously raise voltage stress concerns. This approach has particular benefits in deep sub micron circuits, such as 90 nm, 65 nm, 45 nm and beyond. In exemplary applications, the improved capacitive decoupling module can be integrated with embedded DRAM circuit modules without the need for extra masks or processes.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit comprising:
a circuit module having a plurality of active components coupled between a pair of supply nodes; and
a capacitive decoupling module coupled to the circuit module, the capacitive decoupling module comprising a plurality of metal-insulator-metal (MiM) capacitors coupled in series between the pair of supply nodes, wherein a voltage between said supply nodes is divided across said plurality of MiM capacitors, thereby reducing voltage stress on said capacitors,
wherein the plurality of MiM capacitors comprises at least first and second MiM capacitors formed in a dielectric layer disposed between a device substrate and a metal interconnect layer formed thereover, the metal interconnect layer having interconnects corresponding to said supply nodes, and
wherein a bottom electrode of the first MiM capacitor is coupled to the metal interconnect layer through a first lateral conductor formed on the device substrate, and a bottom electrode of the second MiM capacitor is coupled to the metal interconnect layer through a second lateral conductor formed on the device substrate, wherein the first and second lateral conductors are insulated from one another.

2. The integrated circuit of claim 1, wherein the circuit module comprises a memory array.

3. The integrated circuit of claim 2, wherein the memory array is a DRAM cell array.

4. The integrated circuit of claim 1, wherein each of the MiM capacitors is formed in parallel with a respective resistor.

5. The integrated circuit of claim 4, wherein the resistors are polysilicon resistors.

6. The integrated circuit of claim 1, wherein said first and second lateral conductors are coupled to the bottom electrodes of the first and second MiM capacitors and to the metal interconnect layer through conductive vias formed in said dielectric layer.

7. The integrated circuit of claim 1, wherein each of said first and second lateral conductors comprises a polysilicon layer having a silicide layer formed thereon, wherein said silicide layers are coupled to the bottom electrodes of said first and second MiM capacitors and to said metal interconnect layer through conductive vias formed in said dielectric layer.

8. The integrated circuit of claim 7, wherein said first and second lateral conductors are formed over a shallow trench isolation formed in said device substrate.

9. The integrated circuit of claim 1, wherein the plurality of MiM capacitors consists of two MiM capacitors.

10. The integrated circuit of claim 1, wherein the plurality of MiM capacitors comprises three or more MiM capacitors.

11. The integrated circuit of claim 1, wherein the metal interconnect layer comprise a first interconnect corresponding to a first supply node from the pair of supply nodes, a second interconnect corresponding to a second supply node form the pair of supply nodes, and at least one third interconnect corresponding to an intermediate voltage node.

12. The integrated circuit of claim 11,
wherein the first interconnect layer is coupled to the first lateral conductor through a first conductive via and the first lateral conductor is coupled to the bottom electrode of the first MiM capacitor through a second conductive via,
wherein the second interconnect layer is coupled to a top electrode of the second MiM capacitor through a third conductive via and the bottom electrode of the second MiM capacitor is coupled to the second lateral conductor through a fourth conductive via, and
wherein a top electrode of the first MiM capacitor is coupled to the bottom electrode of the third MiM capacitor through the at least one third interconnect.

13. The integrated circuit of claim 11, wherein the first and second lateral conductors comprise first and second polysilicon dummy gates, respectively, the first and second dummy gates being spaced from one another and formed over an insulation region formed in the device substrate.

14. The integrated circuit of claim 11,
wherein the plurality of MiM capacitors comprises three or more MiM capacitors, and
wherein the at least one third interconnect comprises two or more interconnects corresponding respectively to two or more intermediate voltage nodes.

15. The integrated circuit of claim 1, wherein each of the respective lateral conductors comprises a suicide pad layer formed on said device substrate., said respective lateral conductors being isolated from one another by an isolation region formed therebetween.

16. The integrated circuit of claim 1, wherein each of the respective lateral conductors comprises a contact plug formed between the device substrate and a respective one of the first and second MINI capacitors, wherein the bottom electrodes of said first and second MiM capacitors are in contact with said contact plugs and said contact plugs are coupled to said metal interconnect layer through conductive vias formed in said dielectric layer.

17. The integrated circuit of claim 16, wherein the contact plugs are formed on respective suicide pad layers formed at the upper surface of said device substrate, wherein said respective silicide pad layers are isolated from one another by an isolation region formed therebetween.

18. An integrated circuit comprising: one or more circuit modules;
one or more capacitive decoupling modules coupled to the one or more circuit modules, wherein each decoupling module includes:
a first node coupled to a first circuit module connection point of the circuit modules;
second node coupled to a second circuit connection point of the circuit modules; and
a plurality of metal-insulator-metal (MiM) capacitors coupled in series between the first and second nodes, thereby dividing the voltage difference between said first and second nodes across said plurality of MiM capacitors and reducing voltage stress on said capacitors,
wherein the plurality of MiM capacitors are formed in a dielectric layer disposed between a device substrate and a metal interconnect layer formed thereover, the metal interconnect layer having first and second interconnects corresponding to the first and second nodes, and
wherein a bottom electrode of each of the MiM capacitors is coupled to a respective lateral conductor formed on the device substrate, the lateral conductors being insulated from one another.

19. The integrated circuit of claim 15, wherein the first node is coupled to a first power level and the second node is coupled to a second power level.

20. The integrated circuit of claim 16, wherein the first power level is a positive power supply voltage and said second power level is ground.

21. The integrated circuit of claim 15, wherein the circuit modules comprise an embedded DRAM cell array.

22. The integrated circuit of claim 15, thrther comprising a respective polysilicon resistor formed in parallel with each of said MIM capacitors.

23. The integrated circuit of claim 15, wherein each lateral conductor comprises a respective silicide region that is electrically coupled to the first metal interconnect layer.

24. The integrated circuit of claim 15, wherein the metal interconnect layer comprises a third interconnect providing a connection node for coupling two MiM capacitors from the plurality of MiM capacitors together.

25. The integrated circuit of claim wherein the third interconnect is coupled to a top electrode of a first one of the two MiM capacitors through a first conductive via, and wherein the third interconnect is coupled to a. bottom electrode of a second one of the two MiM capacitor through a second conductive via that connects the third interconnect to one of the lateral conductors and as third conductive via that connects the one of the lateral conductors to the bottom electrode of the second MiM capacitor.

26. The integrated circuit of claim 15, wherein each lateral conductor comprises a polysilicon dummy gate, the dummy gates being spaced from one another and formed over an insulation region formed in the device substrate.

* * * * *

UNITED STATES PATENT AND TRADEMARK OFFICE
CERTIFICATE OF CORRECTION

| | | |
|---|---|---|
| PATENT NO. | : 8,436,408 B2 | Page 1 of 1 |
| APPLICATION NO. | : 12/212096 | |
| DATED | : May 7, 2013 | |
| INVENTOR(S) | : Kuo-Chi Tu et al. | |

It is certified that error appears in the above-identified patent and that said Letters Patent is hereby corrected as shown below:

IN THE CLAIMS:

Claim 15, Column 7, Line 8, delete "suicide" and insert -- silicide --.

Claim 15, Column 7, Line 9, delete "." after "substrate".

Claim 16, Column 7, Line 15, delete "MINI" and insert -- MiM --.

Claim 17, Column 7, Line 21, delete "suicide" and insert -- silicide --.

Claim 18, Column 7, Line 32, insert -- module -- after "circuit".

Claim 19, Column 8, Line 8, delete "claim 15" and insert -- claim 18 --.

Claim 20, Column 8, Line 11, delete "claim 16" and insert -- claim 19 --.

Claim 21, Column 8, Line 14, delete "claim 15" and insert -- claim 18 --.

Claim 22, Column 8, Line 17, delete "claim 15" and insert -- claim 18 --.

Claim 22, Column 8, Line 17, delete "thrther" and insert -- further --.

Claim 22, Column 8, Line 19, delete "MIM" and insert -- MiM --.

Claim 23, Column 8, Line 20, delete "claim 15" and insert -- claim 18 --.

Claim 24, Column 8, Line 23, delete "claim 15" and insert -- claim 18 --.

Claim 25, Column 8, Line 27, insert -- 24, -- after "claim".

Claim 25, Column 8, Line 34, delete "as" and insert -- a --.

Claim 26, Column 8, Line 37, delete "claim 15" and insert -- claim 18 --.

Signed and Sealed this
Twenty-second Day of April, 2014

Michelle K. Lee
*Deputy Director of the United States Patent and Trademark Office*